(12) United States Patent
Suganaga et al.

(10) Patent No.: US 7,727,709 B2
(45) Date of Patent: Jun. 1, 2010

(54) METHOD OF FORMING RESIST PATTERN AND METHOD OF MANUFACTURING SEMICONDUCTOR DEVICE

(75) Inventors: Toshifumi Suganaga, Tokyo (JP); Tetsuro Hanawa, Tokyo (JP); Takeo Ishibashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 584 days.

(21) Appl. No.: 11/700,131

(22) Filed: Jan. 31, 2007

(65) Prior Publication Data
US 2007/0224546 A1 Sep. 27, 2007

(51) Int. Cl.
*G03F 7/26* (2006.01)
(52) U.S. Cl. .................................. 430/322; 430/330
(58) Field of Classification Search ................. 430/311, 430/322, 330
See application file for complete search history.

(56) References Cited
U.S. PATENT DOCUMENTS
2007/0134593 A1* 6/2007 Hirayama et al. ........ 430/270.1
FOREIGN PATENT DOCUMENTS
JP 7-295228 A 11/1995
JP 8-15859 A 1/1996

OTHER PUBLICATIONS

Jeng-Horng Chen et al., "Characterization of ArF immersion process for production," Optical Microlithography XVIII, edited by Bruce W. Smith, Proceedings of the SPIE 2005, vol. 5754, pp. 13-22.

* cited by examiner

*Primary Examiner*—Kathleen Duda
(74) *Attorney, Agent, or Firm*—McDermott Will & Emery LLP (57) ABSTRACT

The present invention improves the OPE characteristic generated by the difference between sparse and dense mask patterns and promotes fidelity in the design of the pattern. Because of this, the present invention includes a step of forming a resist having an acid dissociative dissolution suppression group on a substrate, a step of coating the resist with an acid polymer dissolved in an alcohol based solvent and forming an upper layer film, a step of exposing through a mask, a step of performing a baking process, and a step of processing with an alkali developer, and wherein in the step of performing a baking process, a mixing layer is formed on the resist by the upper layer film and in which a thicker mixing layer is formed in an unexposed part of a region where the pattern density of the mask pattern is high compared to a region where the pattern density is low.

8 Claims, 8 Drawing Sheets

METHOD OF FORMING RESIST PATTERN AND METHOD OF MANUFACTURING SEMICONDUCTOR DEVICE

BACKGROUND OF THE INVENTION

1. Field of the Invention

The invention relates to a method of forming a resist pattern, which improves an OPE characteristic generated by the difference between sparse and dense mask patterns and has high fidelity to the design of the pattern, and a method of manufacturing a semiconductor device using the method of forming the resist pattern.

2. Description of the Background Art

With high integration of semiconductor devices, a method of manufacturing a semiconductor that is suitable for a micro process has been studied and developed. However, deterioration of fidelity to the design of the pattern based on the optical proximity effect (referred to as "OPE" below) by adjacent patterns has been a problem, and the OPE characteristic is an important parameter in miniaturization.

In photolithography, it is known that multiple interferences of light occur in a resist film, and the dimensional width of the resist pattern changes along with changes in the resist film thickness. The multiple interferences of light occur as a result of irradiated light that is incident on the resist film formed on the substrate interfering with the reflected light from the substrate, and the amount of optical energy absorbed in the thickness direction of the photoresist film differs.

Figure 9A:
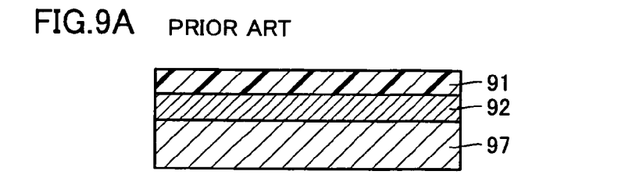
FIGS. 9A to 9F and FIGS. 10A to 10H are step diagrams showing the conventional method of forming a resist pattern.
Figure 9B:
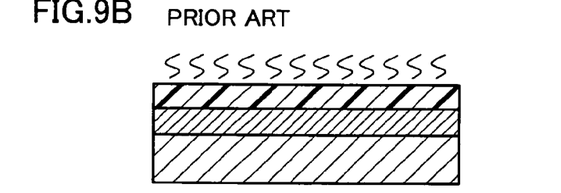
Figure 9C:
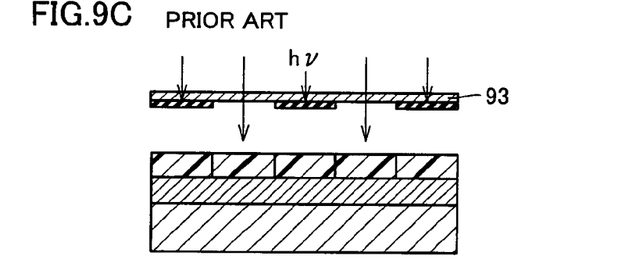
Figure 9D:
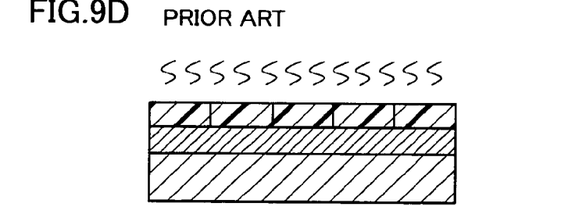
Figure 9E:
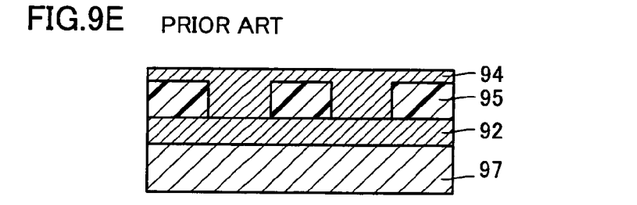
Figure 9F:
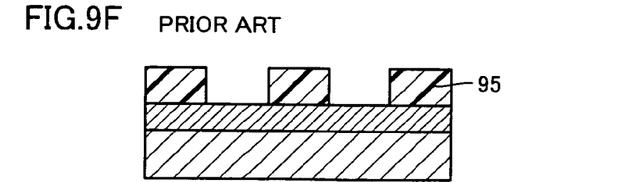

As described in Japanese Patent Laying-Open No. 08-015859, a method of forming an anti-reflective film on the substrate as a means of reducing multiple interfering actions of light in the resist film is conventionally known. The conventional method of forming a resist pattern in which the anti-reflective film is formed on the substrate is shown in FIGS. 9A to 9F. In this method, first, as shown in FIG. 9A, an anti-reflective film 92 is formed on a semiconductor substrate 97, and then a resist film 91 is spin-coated, and next, as shown in FIG. 9B, resist film 91 is baked and hardened. Continuously, as shown in FIG. 9C, an exposure process is performed through a mask 93, and after exposure, as shown in FIG. 9D, it is baked. Then, as shown in FIG. 9E, it is processed with a 2.38% alkali developer 94, and a fixed resist pattern 95 as shown in FIG. 9F is obtained. Although the interfering action can be reduced to some degree by anti-reflective film 92 on substrate 97, the OPE can not be improved sufficiently.

In order to prevent in-film multi-reflection inside the resist or to prevent the deactivation of an acid of a chemical amplification type resist due to amine in air, as described in Japanese Patent Laying-Open No. 07-295228, a method of forming an upper layer film of a water-soluble polymer on the resist is known. In the chemical amplification type resist, there is an acid catalyst type resist in which an acid is generated in the exposed part as a catalyst, and it is a resist with high sensitivity and high resolution because the catalyst is used. However, after exposure and before baking is performed, the acid catalyst generated in the exposed part becomes inactive due to the influence of a small amount of amine which exists in air, and the line width and resolution of the resist change. It is considered that the formation of the upper layer film is effective in preventing such a PED (Post Exposure Delay) phenomenon.

Figure 10A:
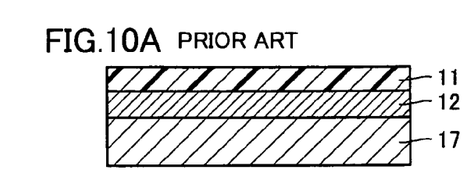
Figure 10B:
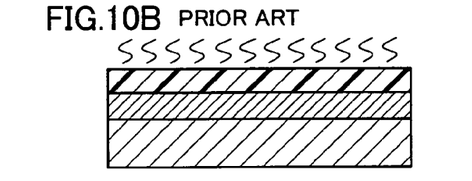
Figure 10C:
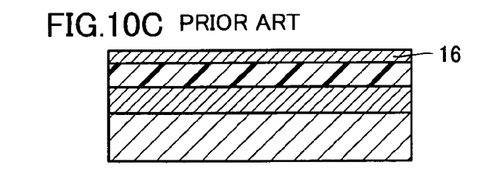
Figure 10D:
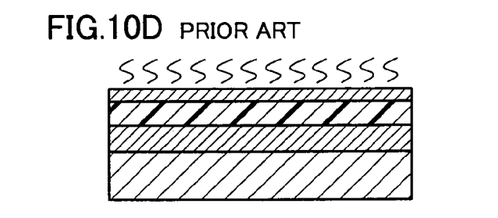
Figure 10E:
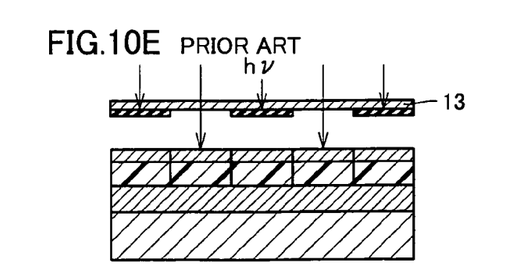
Figure 10F:
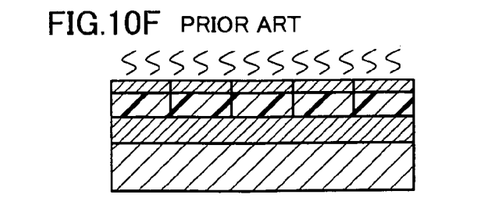
Figure 10G:
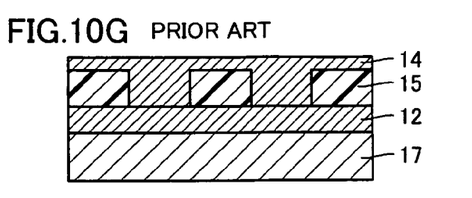
Figure 10H:
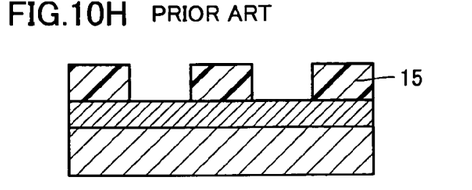

The conventional method of forming a resist pattern in which an upper layer film is formed is shown in FIGS. 10A to 10H. First, as shown in FIG. 10A, an anti-reflective film 12 is formed on a substrate 17, and then a resist film 11 is spin-coated, and next, as shown in FIG. 10B, the resist film 11 is baked and hardened. Continuously, as shown in FIG. 10C, after an upper layer film 16 is formed on a water-soluble polymer, it is baked and hardened as shown in FIG. 10D. Next, as shown in FIG. 10E, an exposure process is performed through a mask 13, and after exposure, as shown in FIG. 10F, it is baked. Then, as shown in FIG. 10G, it is processed with a 2.38% alkali developer 14, and a fixed resist pattern 15 as shown in FIG. 10H is obtained. However, because the upper layer film formed in such a manner is water-soluble and does not penetrate into the resist, and a mixing layer is not formed, the OPE characteristic generated by the difference between sparse and dense resist patterns can not be improved (Jeng-Horng Chen et al., "Characterization of ArF immersion process for production", Optical Microlithography XVIII, edited by Bruce W. Smith, Proceedings of the SPIE 2005, Vol. 5754, pp. 13-22).

SUMMARY OF THE INVENTION

Figure 2:
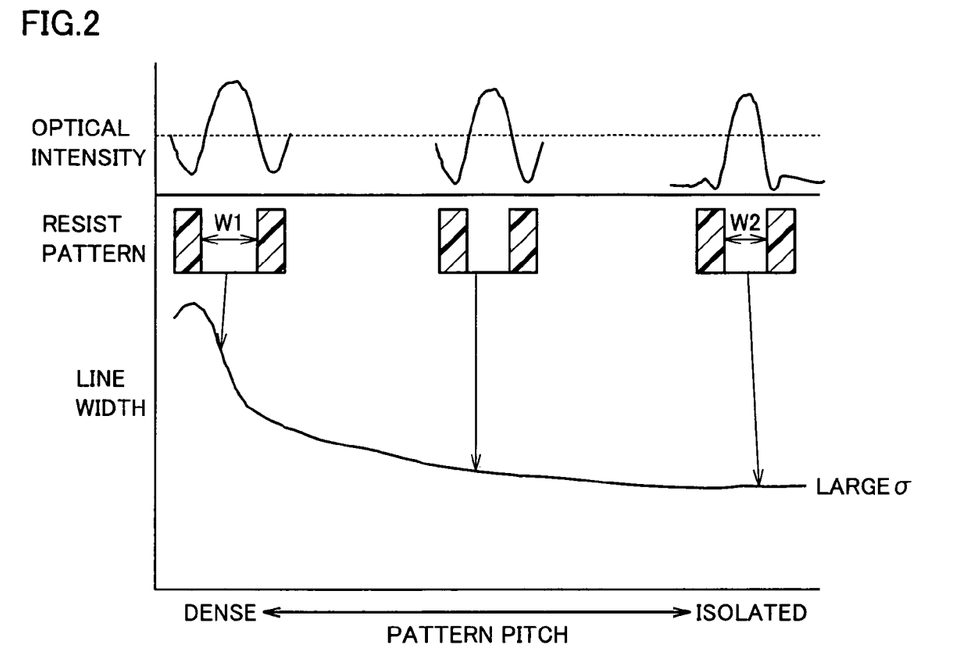
FIG. 2 is a figure showing the relationship between the optical intensity of the mask pattern obtained through a mask and the OPE.

The relationship between the optical intensity of the mask pattern obtained through a mask and the OPE is shown in FIG. 2. In FIG. 2, the pitch of the space pattern in the dimension of the pattern itself is taken in the horizontal axes and varies from a dense pattern to an isolated pattern. Further, the optical intensity of the mask pattern, the shape of the resist pattern obtained with the optical intensity, and the line width of a hole part are shown in the vertical axes. The case of large a is shown as an illumination condition. As is obvious from FIG. 2, as the pattern pitch becomes denser, the optical contrast of the mask pattern deteriorates. Further, because a line width w1 of a dense pattern is wider than a line width w2 of an isolated pattern, when the dimension of the pattern at the same exposure amount is designed using the dense pattern as a standard, the line width becomes thinner as the pattern becomes more isolated, and there is a problem that the OPE characteristic decreases.

Figure 3A:
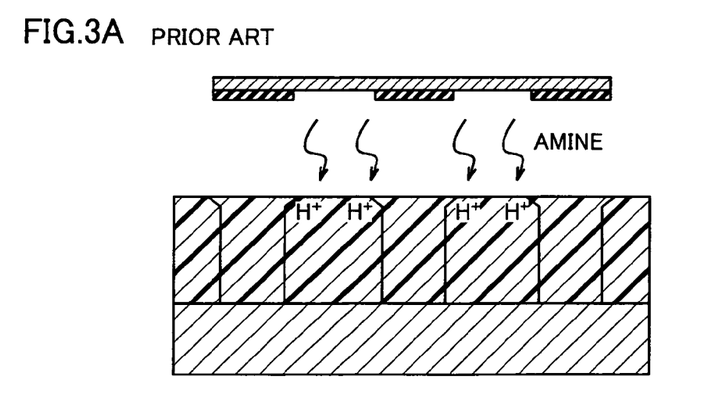
FIGS. 3A and 3B are step diagrams showing the conventional method of forming a resist pattern in which an upper layer film is not formed.
Figure 3B:
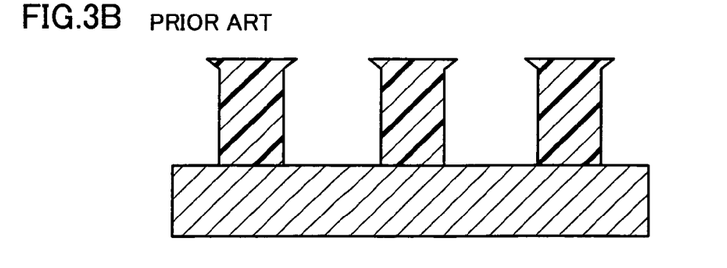

Further, in the conventional method of forming a resist pattern in which the upper layer film is not formed, because the generated acid catalyst $H^+$ is deactivated by amine existing in air after exposure, and while the baking process is performed as shown in FIG. 3A and does not support the chemical reaction, in the case of a positive resist there is a problem that the top part of the resist remains without being removed and that a sectional shape of the resist becomes a T-shape as shown in FIG. 3B, that is, the resist pattern is made into a T-top.

Figure 4A:
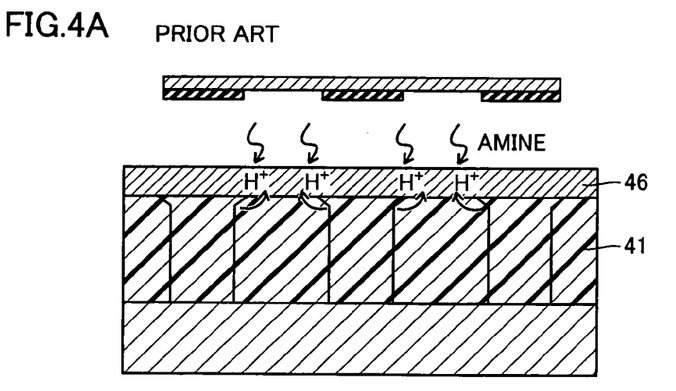
FIGS. 4A and 4B are step diagrams showing the conventional method of forming a resist pattern in which an upper layer film is formed.
Figure 4B:
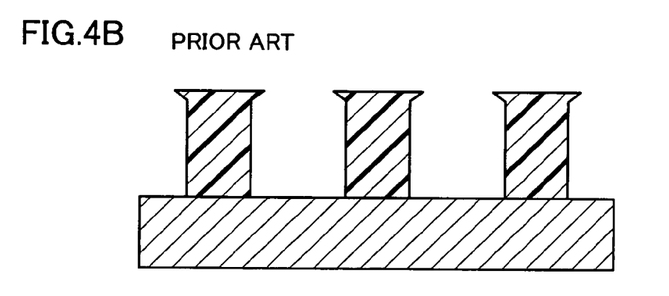

On the other hand, in the conventional method of forming a resist pattern in which the upper layer film is formed, as shown in FIG. 4A, the influence of amine existing in air can be cut off by an upper layer film 46. However, because the acid catalyst $H^+$ generated by exposure diffuses into a water-soluble polymer of the upper layer film 46 from a resist 41 and the acid catalyst $H^+$ is diluted, the catalyst does not support the chemical reaction sufficiently, and as a result, as shown in FIG. 4B, there is a problem that the resist pattern is made into a T-top.

Figure 5:
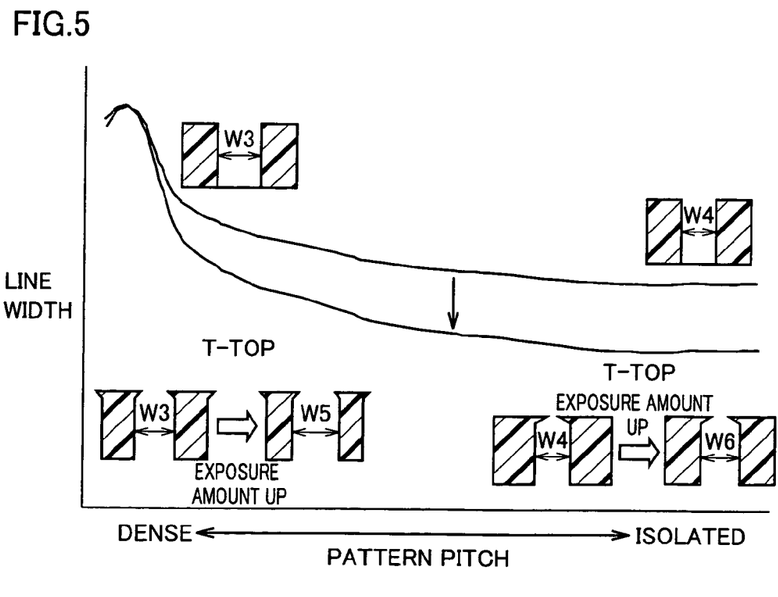
FIG. 5 is a figure showing the mechanism of deterioration of the OPE characteristic accompanied by deterioration of the shape of the resist.

The mechanism of deterioration of the OPE characteristic accompanied by deterioration of the shape of the resist is shown in FIG. 5. In the case that deterioration of the shape of the resist is induced, such as being made into a T-top, because the line width of the dense pattern w3 is wider than the line width of the isolated pattern w4, and the wraparound of light is large at an unexposed part, it is difficult to proceed in making a T-top in the dense pattern. On the other hand, wraparound of light is small in the isolated pattern and it is easy to proceed in making a T-top due to amine etc. Therefore, when the exposure amount is increased to finish the isolated pattern to a fixed line width w6, the exposure amount becomes excessive in the dense pattern and it becomes a broader line width w5. Because of this, it causes the OPE characteristic to become worse as the deterioration of the shape of the resist is induced, and the fidelity to the design of the pattern deteriorates.

The objective of the present invention is to provide a method of forming a resist pattern, which improves a dissolution contrast, improves the OPE characteristic generated by the difference between sparse and dense mask patterns, and has high fidelity to the design of the pattern by coating the resist with an acid polymer dissolved in an alcohol based solvent as an upper layer film and forming a mixing layer on the resist. Further, it is to provide a method of manufacturing a semiconductor device using the method of forming the resist pattern.

The present invention is a method of forming a resist pattern by photolithography, and consists of a step of forming a resist having an acid dissociative dissolution suppression group on a substrate, a step of coating the resist with an acid polymer dissolved in an alcohol based solvent and forming an upper layer film, a step of exposing through a mask, a step of performing a baking process, and a step of processing with an alkali developer; and in which in the step of performing a baking process, a mixing layer is formed on the resist by the upper layer film and a thicker mixing layer is formed in the non-exposed part of the region where the pattern density of the mask pattern is high compared to the region where the pattern density is low.

Further, the method of manufacturing a semiconductor device in the present invention consists of a step of forming a resist pattern on an underlying film that is formed on a semiconductor substrate or in the semiconductor substrate using the above-described method of forming a resist pattern, and a step of patterning the semiconductor substrate or the underlying film using the resist pattern as a mask.

The OPE characteristic generated by the difference between sparse and dense mask patterns can be improved, and fidelity to the design of the pattern can be promoted. Further, the method of forming the resist pattern is useful in a method of manufacturing the entire semiconductor device with 90 nm to 32 nm design rules and semiconductor devices with design rules thereafter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The method of forming a resist pattern in the present invention consists of a step of forming a resist having an acid dissociative dissolution suppression group on a substrate, a step of coating the resist with an acid polymer dissolved in an alcohol based solvent and forming an upper layer film, a step of exposing through a mask, a step of performing a baking process, and a step of processing with an alkali developer; and in which in the step of performing a baking process, a mixing layer is formed on the resist by the upper layer film. A thicker mixing layer can be formed in an unexposed part of the region where the pattern density of the mask pattern is high compared to the region where the pattern density is low.

Because the exposure amount becomes large in a region where the pattern density of the mask pattern is high due to diffraction, etc., penetration of the solvent to the resist in the upper layer film becomes large. Therefore, a thick mixing layer is formed, and in a region where the pattern density is low, a thin mixing layer is formed. Because the thicker the mixing layer is formed, the lower the solubility in the developing step becomes, and the solubility can be decreased more greatly in a region where the pattern density is high compared to a region where the pattern density is low. By controlling the solubility in such a manner, the OPE characteristic due to the difference between sparse and dense mask patterns can be improved, and fidelity to the design of the pattern can be promoted. Therefore, such method of forming a resist pattern is applied to a method of manufacturing a semiconductor device, and by forming a resist pattern on a semiconductor substrate or on an underlying film formed on the semiconductor substrate and then by patterning the semiconductor substrate or the underlying film using the resist pattern as a mask, scattering due to the difference between sparse and dense patterns can be reduced and the pattern can be formed per the designed dimension with good accuracy.

Figure 7:
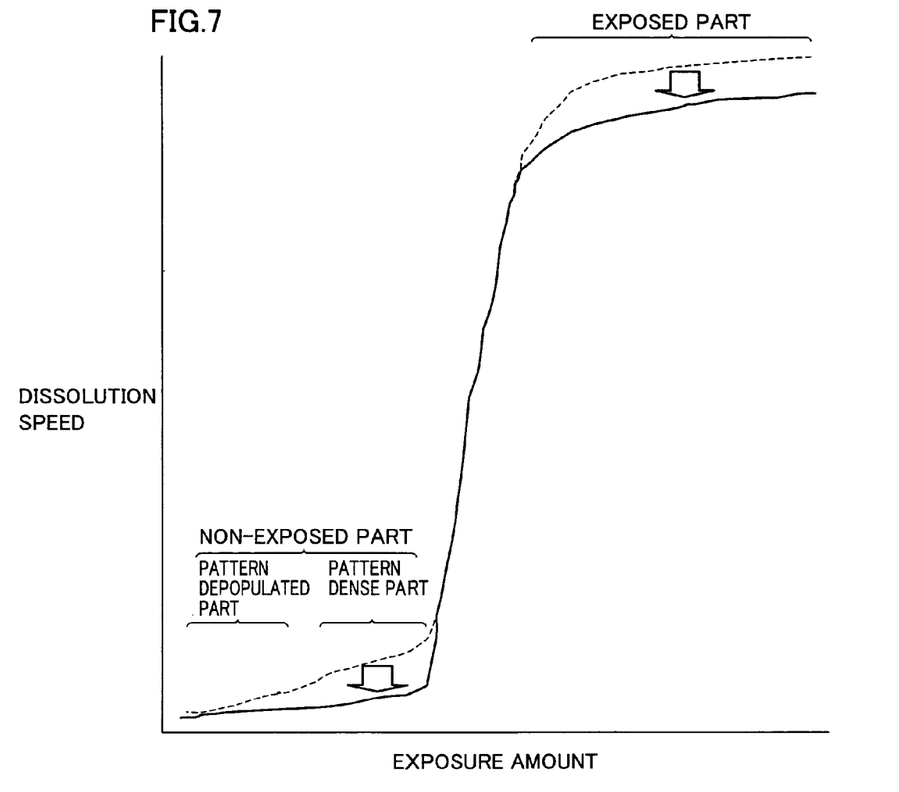
FIG. 7 is a figure showing variations of dissolution contrast due to the sparse and dense patterns.

The variations of dissolution contrast due to the sparse and dense patterns is shown in FIG. 7. In FIG. 7, the case of the conventional method of forming a pattern is shown with a dotted line, and the case of the method in the present invention is shown with a solid line. In the conventional method of forming a pattern, because the exposure amount is large as the pattern density is high in an unexposed part that influences the pattern dimension, the dissolution speed of the resist becomes large, a difference in the dissolution speed of the resist is generated due to sparseness and denseness of the pattern density, and there is the effect the OPE characteristic deteriorates due to the sparse and dense patterns. According to the present invention, because the dissolution speed of the resist decreases largely as the pattern density is high in the non-exposed part, the dissolution speeds in a region where the pattern density is high and in a region where the pattern density is low can be made uniform. By adjusting the dissolution contrast corresponding with the pattern density in such a manner, the OPE characteristic due to a difference in the pattern density can be improved. Further, because the deactivation of an acid catalyst due to amine existing in ambient atmosphere can be suppressed after exposure to the baking process by forming the resist and the mixing layer, the making into a T-top in the resist can be prevented, and the OPE characteristic with the deterioration of the shape of the resist can be improved.

The mixing layer is a layer formed by an acid polymer and a solvent in the upper layer film penetrating into the resist by diffusing and mixing, and is a layer in which a water-soluble film forming component and/or an alkali-soluble film forming component of the upper layer film composition are/is included in a base polymer having an acid dissociative dissolution suppression group in the resist composition. The acid dissociative dissolution suppression group in the resist has an alkali dissolution suppression property that makes the entire resin component alkali-insoluble before exposure, and the entire resin component can be changed to alkali-soluble when the acid dissociative dissolution suppression group is separated due to an acid generated by an acid generator included in the resist as baking is performed at exposure and after exposure (Post Exposure Bake) (may be referred to as "PEB" below). However, the ratio of the acid dissociative dissolution suppression group separating increases corresponding to the exposure amount radiating on the resist, and as a result, because a water-soluble film forming material, an alkali-soluble film forming component, and a solvent in the upper layer film penetrate easily as the exposure amount increases, the mixing layer becomes thick. The thickness of the mixing layer in the exposed part is about 10 nm to 100 nm, and 0 to 30 nm in the non-exposed part. Further, because the amount of diffracting light changes with the mask pattern density, when the pattern density increases, the amount of diffracting light increases and the mixing layer in the exposed part and in the non-exposed part becomes thick.

An ArF resist, which is a resist that is sensitive to an ArF excimer laser beam, etc. can be used as the resist applied on the substrate. On the other hand, in the respect of the quality of material, a resist consisting of at least a base polymer having an acid dissociative dissolution suppression group, an acid generator, and a solvent can be used as a positive resist composition, two kinds or more of the base polymer may be mixed and used, and furthermore other conventionally known resins for a photo resist composition can be mixed and used. Furthermore, in order to improve the shape of the resist pattern, stability over the passage of time, etc., a quencher, and if desired, miscible additives such as an additional resin to improve the performance of the resist film, a surfactant to improve the coating property, a dissolution suppressant, a plasticizer, a stabilizer, a colorant, and an antihalation agent can be included appropriately.

The base polymer of the resist composition includes a polymer consisting of a (meth)acrylic acid ester unit, a polymer having a configuration unit including an acid anhydride of dicarboxylic acid, a polymer having a configuration unit including a phenolic hydroxyl group, a silsesquioxane resin, a polymer having an α-(hydroxyalkyl)acrylic acid unit, and a polymer having a dicarboxylic acid monoester unit. Further, a polymer having an alkali soluble configuration unit including an aliphatic cyclic group having both (i) a fluorine atom or a fluorinated alkyl group and (ii) an alcohol hydroxyl group or an alkyloxy group can be used.

The acid dissociative dissolution suppression group includes an acid dissociative dissolution suppression group including an aliphatic polycyclic group, and examples of the polycyclic group include a group in which one hydrogen atom is removed from bicycloalkane, tricycloalkane, or tetracycloalkane which is substituted or unsubstituted with a fluorine atom or a fluorinated alkyl group. A specific example includes a group in which one hydrogen atom is removed from polycycloalkane such as adamantane, norbornane, isobornane, tricyclodecane, and tetracyclododecane. The polycyclic group can be used by being selected appropriately from many resists proposed as an ArF resist. However, an adamantane group, a norbornyl group, and a tetracyclododecanyl group are preferable industrially.

The acid generator include an onium salt such as diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethane sulfonate, (4-methylphenyl)diphenylsulfonium trifluoromethane sulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, triphenylsulfonium nonafluorobutanesulfonate, (4-trifluoromethylphenyl)diphenylsulfonium trifluoromethanesulfonate, (4-trifluoromethylphenyl)diphenylsulfonium nonafluorobutanesulfonate, and tri(p-tert-butylphenyl)sulfonium trifluoromethanesulfonate. Among the onium salts, the triphenylsulfonium salts can be used preferably because they are difficult to decompose and are difficult to generate organic gas. The amount of the triphenylsulfonium salt is preferably 50 mol % to 100 mol % to the total amount of the acid generator, more preferably 70 mol % to 100 mol %, and the most preferably 100 mol %.

The solvent of the resist that can be used is appropriately selected from one kind or two kinds or more of any known kinds. Examples include ketones such as acetone, methylethylketone, cyclohexanone, methylisoamineketone, and 2-heptanone, polyhydric alcohols such as monomethyl ethers of ethylene glycol, ethylene glycol monoacetate, diethylene glycol, diethylene glycol monoacetate, propylene glycol, propylene glycol monoacetate, dipropylene glycol, or dipropylene glycol monoacetate, monoethyl ether, monopropyl ether, monobutyl ether, and monophenyl ether, and their derivatives, cyclic ethers such as dioxane, and esters such as methyl lactate, ethyl lactate, methyl acetate, ethyl acetate, butyl acetate, methyl pyruvate, ethyl pyruvate, methyl methoxypropionate, and ethyl etoxypropionate. These organic solvents may be used individually and may be used as a mixed solvent of two kinds or more.

A known amine etc. can be used as a quencher to improve the shape of the resist pattern and the stability over the passage of time, etc. However, a secondary lower aliphatic amine, tertiary lower aliphatic amine, and organic acid such as organic carboxylic acid and oxoacid of phosphorus can be included preferably. The lower aliphatic amine refers to an amine of alkyl or alkyl alcohol having 5 or less carbon atoms, and examples of the secondary and tertiary amines include trimethylamine, diethylamine, triethylamine, di-n-propylamine, tri-n-propylamine, tripentylamine, diethanolamine, and triethanolamine. However, alkanolamine such as triethanolamine is especially preferable. These may be used individually, and two kinds or more of them may be combined and used. These amines are used normally in the range of 0.01% by mass to 2.0% by mass to the resin component. The preferred examples of the organic carboxylic acid include malonic acid, citric acid, malic acid, succinic acid, benzoic acid, and salicylic acid. The oxoacid of phosphorous and its derivatives include phosphoric acids and the derivatives such as their ester, e.g., phosphoric acid, phosphoric acid di-n-butyl ester and phosphoric acid diphenyl ester, phosphonic acids and the derivatives such as their ester, e.g., phosphonic acid, phosphonic acid dimethyl ester, phosphonic acid di-n-butyl ester, phenylphosphonic acid, phosphonic acid diphenyl ester, and phosphonic acid dibenzyl ester, phosphinic acids and the derivatives such as their ester, e.g., phosphinic acid and phenylphosphinic acid, and phosphonic acid is especially preferable among these. The organic acid is used at a ratio of 0.01 parts by mass to 5.0 parts by mass per the resin component 100 parts by mass. These may be used individually, and two kinds or more of them may be combined and used. These organic acids are preferably used at the range of an equimolar amount or less to amine.

The material of the upper layer film includes at least one kind selected from the water-soluble film forming component and the alkali-soluble film forming component, is a composition including at least an acid polymer and a solvent, and can be included with a surfactant, etc. if desired.

Polymers having a refractive index $n_d$ of 1.40 to 1.80 can be used as the acid polymer, and for example the polymers that can be used include at least one kind selected from an acid generator and acid compounds, and the acid compound is at least one kind selected from carboxylic acid, sulfonic acid, and sulfonyl compounds having at least a fluorinated hydrocarbon group. Further, the polymers that can be used include a nitrogen compound, and the nitrogen compound is at least one kind selected from quaternary ammonium hydroxide and alkanolamine compounds or the nitrogen compound is as least one kind selected from amino derivatives.

An example of the water-soluble film forming component that can be used is a cellulose based polymer such as hydroxypropylmethyl cellulose phthalate, hydroxypropylmethyl cellulose acetate phthalate, hydroxypropylmethyl cellulose acetate succinate, hydroxypropylmethyl cellulose hexahydrophthalate, hydroxypropylmethyl cellulose, hydroxypropyl cellulose, hydroxyethyl cellulose, cellulose acetate hexahydrophthalate, carboxymethyl cellulose, ethyl cellulose, and methyl cellulose. Further, an acrylic acid based polymer having acrylic acid, etc. as a monomer such as N,N-dimethylacylamido, N,N-dimethylaminopropylmethacrylamido, N,N-dimethylaminopropylacrylamido, N-methylacrylamido, diacetone acrylamido, N,N-dimethylaminoethylmethacrylate, N,N-diethylaminoethylmethacrylate, N,N-dimethylaminoethylacrylate, and acryloylmorpholine may be used. Among these, the acrylic acid based polymer which is a water-soluble polymer not having a hydroxyl group and polyvinylpyrrolidone are preferable. These water-soluble film forming components may be used individually, and two kinds or more of them may be combined and used.

An example of the alkali-soluble film forming component that can be used is a novolac resin obtained by condensing phenols (such as phenol, m-cresol, xylenol, and trimethylphenol), aldehydes (such as formaldehyde, 3-hydroxybenzaldehyde, and 4-hydroxybenxaldehyde) and/or ketones (such as methylethylketone and acetone) under the existence of an acid catalyst. Further, a hydroxystyrene based resin such as a single polymer of hydroxystyrene, a copolymer of hydroxystyrene and other styrene based monomers, a copolymer of hydroxystyrene and acrylic acid, methacrylic acid, or its derivatives can be used. The alkali-soluble film forming components may be used individually, and two kinds or more of them may be combined and used. Between the water-soluble film forming component and the alkali-soluble film component, the water-soluble film forming component is preferable as the component used for a material for forming the upper layer film in the present invention.

Known kinds of acid generator used for the amplification type resist can be used as the acid generator in the acid polymer. Specifically, the acid generator includes an onium salt such as diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, triphenylsulfonium nonafluorobutanesulfonate, (4-trifluoromethylphenyl)diphenylsulfonium trifluoromethanesulfonate, (4-trifluoromethylphenyl)diphenylsulfonium nonafluorobutanesulfonate, and tri(p-tert-butylphenyl)sulfonium trifluoromethanesulfonate.

Further, the acid compounds include inorganic acids such as hydrochloric acid, sulfuric acid, nitric acid, and phosphoric acid, and organic acids such as formic acid, acetic acid, propionic acid, benzenesulfonic acid, and toluenesulfonic acid. The organic acids may be used individually, and two kinds or more of them may be combined and used.

The kinds of the acid compounds represented with Formulas (1), (2), and (3) are preferable.

$$R_{1f}FCOOH \tag{1}$$

In Formula (1), $R_{1f}$ is a fluorinated hydrocarbon group in which a part of or a whole hydrogen atom of a saturated or unsaturated hydrocarbon group having 1 to 20 carbon atoms is substituted with a fluorine atom.

$$R_{1f}SO_3H \tag{2}$$

$$R_{2f}(SO_2R_{1f})n \tag{3}$$

In Formula (3), $R_{2f}$ is an amino group or a saturated or unsaturated and fluorine-substituted or unsubstituted hydrocarbon group having 1 to 20 carbon atoms, and n is an integer of 1 to 4.

Here, the fluorine-substituted carboxylic acid represented with Formula (1) includes perfluoroheptanoic acid and perfluorooctanoic acid, and further, the fluorine-substituted sulfonic acid represented with Formula (2) includes perfluoropropylsulfonic acid, perfluorooctylsulfonic acid, and perfluorodecylsulfonic acid. A specific example of perfluoroheptane acid is EF-201 (manufactured by Tohkem Products Corp.) and a specific example of perfluorooctylsulfonic acid is EF-101 (manufactured by Tohkem Products Corp.). Further, the fluorine-substituted sulfonyl compounds represented with Formula (3) include tris(trifluoromethylsulfonyl)methane, bis(trifluoromethylsulfonyl)ammonium, and bis(heptafluoroethylsulfonyl)ammonium.

Examples of the nitrogen compounds include quaternary ammonium hydroxide, alkanolamine compounds, and amino acid derivatives. The quaternary ammonium hydroxide includes a tetramethylammonium hydroxide, a tetraethylammonium hydroxide, a tetrapropylammonium hydroxide, a tetrabutylammonium hydroxide, a methyltripropylammonium hydroxide, and a methyltributylammonium hydroxide. Examples of the alkanolamine compounds include monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, and triisopropanolamine.

Examples of the amino acid derivatives include glycine, alanine, valine, leucine, isoleucine, proline, phenylalanine, tryptophan, methionine, serine, threonine, cysteine, tyrosine, asparagines, glutamine, aspartic acid, glutamic acid, lysine, alginine, histidine, 4-hydroxyproline, desmosine, γ-aminobutyric acid, and β-cyanoalanine.

Any solvent can be used as the solvent that dissolves the acid polymer as long as it does not have a property to dissolve the resist film and it may dissolve the acid polymer. Such a solvent includes an alcohol based solvent, a paraffin based solvent, and a fluorine based solvent. A common alcohol based solvent such as isopropyl alcohol, isobutyl alcohol, 1-hexanol, 2-methyl-1-propanol, and 4-methyl-2-pentanol can be used as the alcohol based solvent, and especially 2-methyl-1-propanol and 4-methyl-2-pentanol are preferable. It is confirmed that n-heptane can be used as the paraffin based solvent and perfluoro-2-butyltetrahydrofuran can be used as the fluorine based solvent. Among these, the alcohol based solvent is preferable in the respect of alkali solubility at development. These may be used individually, and two kinds or more of them may be combined and used.

Besides the above-described compositions, at least one kind selected from anionic surfactants may be included in the material for forming the upper layer film. Specific examples of the anionic surfactants include ammonium alkyldiphenylether sulfonate, tetramethylammonium alkyldiphenylether sulfonate, trimethylethanolammonium alkyldiphenylether sulfonate, triethylammonium alkyldiphenylether sulfonate, ammonium alkyldiphenylether disulfonate, diethanolammonium alkyldiphenylether disulfonate, and tetramethylammonium alkyldiphenylether disulfonate. However, it is not limited to these. Moreover, the alkyl group in the above-described compound has 5 to 18 carbon atoms, and may be substituted with an alkoxy group having 5 to 18 carbon atoms. These anionic surfactants may be used individually, and two kinds or more of them may be combined and used.

The preferred embodiment including affinity with the resist is an embodiment in which the base polymer of the resist composition is a polymer consisting of an acrylic acid ester unit, in which the solvent in the upper layer film is a mixture of an alcohol based solvent and a fluorine based solvent, and in which a hydrophilic surfactant is added as an additive.

Example 1

Figure 1A:
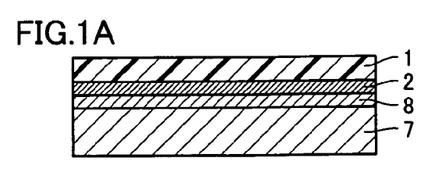
FIGS. 1A to 1J are step diagrams showing a method of manufacturing a semiconductor using the method of forming a resist pattern in the present invention.
Figure 1B:
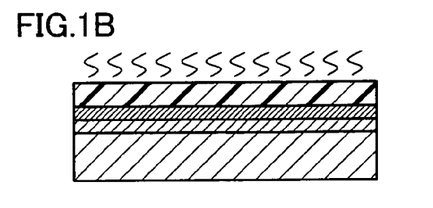
Figure 1C:
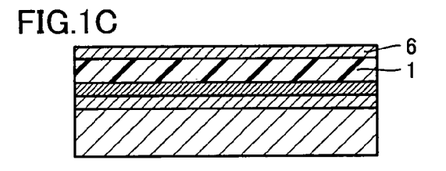

In Example 1, a semiconductor device is manufactured using a chemical amplification positive resist, using a method of forming a resist pattern in the present invention, and irradiating with a ArF excimer laser beam (wavelength 193 nm). Its step diagram is shown in FIGS. 1A to 1J. First, as shown in FIG. 1A, an underlying film 8 consisting of a layered film of a silicon oxide film and a conductive film such as polysilicon is formed on a semiconductor substrate 7, an anti-reflective film 2 (ARC029A manufactured by Nissan Chemical Industries, Ltd.) is formed at a thickness of 78 nm, and a positive resist (TArF-P6111 manufactured by Tokyo Ohka Kogyo Co. Ltd.) is spin-coated. Next, as shown in FIG. 1B, a resist 1 of film thickness 250 nm is obtained by a prebake before exposure at 100° C. to 150° C. Next, as shown in FIG. 1C, an upper layer film 6 (TILC-021 manufactured by Tokyo Ohka Kogyo Co. Ltd.) is spin-coated. A solution in which an acid polymer is dissolved in an alcohol based solvent such as isobutyl alcohol is used as a material for the upper layer film.

Figure 1D:
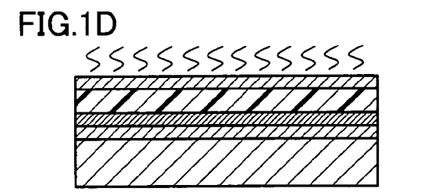
Figure 1E:
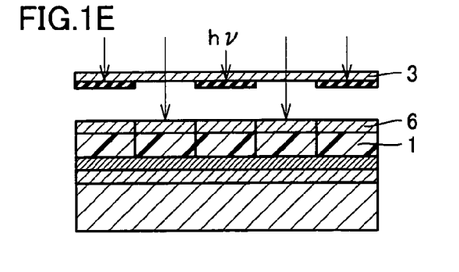
Figure 1F:
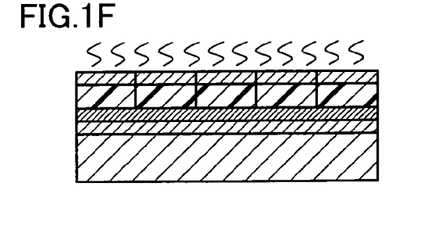
Figure 1G:
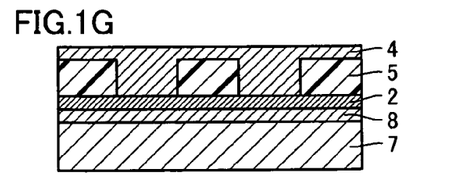
Figure 1H:
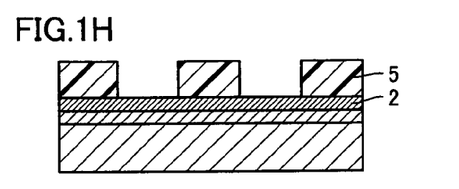
Figure 1I:
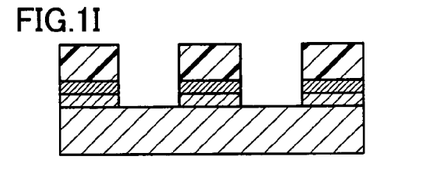
Figure 1J:
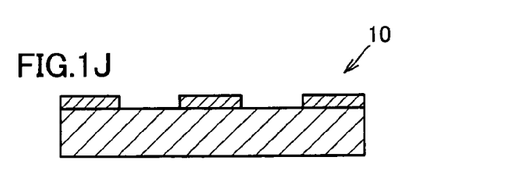

Next, as shown in FIG. 1D, a thermal process is performed at 80° C. to 150° C. to vaporize the solvent of spin-coated upper layer film 6. After this, as shown in FIG. 1E, substrate 7 in which upper layer film 6 and resist 1 are formed is inserted into a reduction projection exposure system having a high numerical aperture (NA), is radiated by a ArF excimer laser beam (wavelength 193 nm) through a mask 3, and resist 1 is projected through upper layer film 6. After this, as shown in FIG. 1F, a baking process (PEB) is performed at 100° C. to 150° C. and acid is generated. Next, as shown in FIG. 1G, by processing with 2.38% alkali developer 4, a fixed resist pattern 5 as shown in FIG. 1H is obtained. After this, as shown in FIG. 1I, anti-reflective film 2 and underlying film 8 are etched with formed resist pattern 5, resist pattern 5 and anti-reflective film 2 are removed by ashing, and a gate pattern as shown in FIG. 1J is formed. Furthermore, a step of injecting source and drain, a step of forming an inter-layered insulating film, and a step of forming an upper layer wiring, which are not shown in the Figs., are performed, and a semiconductor device 10 is obtained.

Figure 11A:
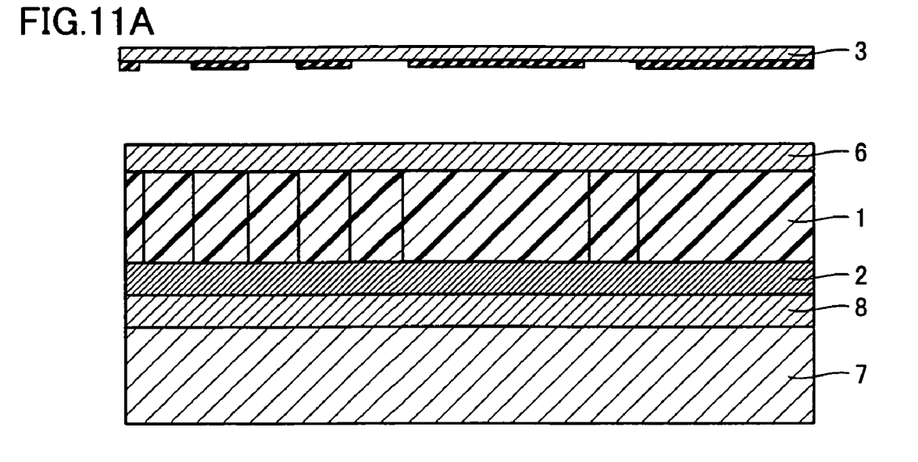
FIGS. 11A to 11C are step diagrams showing the method of forming a resist pattern in the present invention.
Figure 11B:
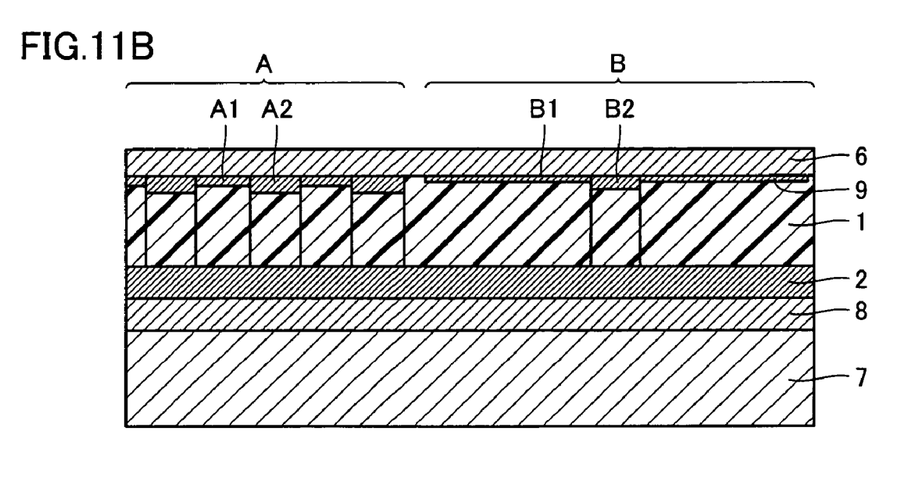
Figure 11C:
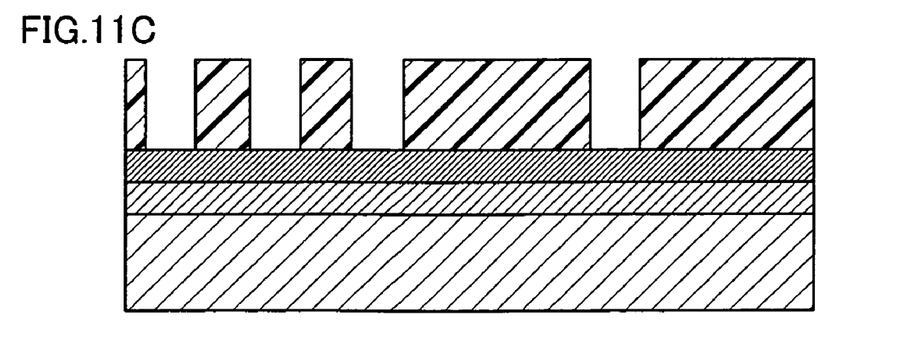

The steps from the exposure step to the developing step in the method of forming a resist pattern in the present invention are shown in FIGS. 11A to 11C. As shown in FIG. 11A, after underlying film 8, anti-reflective film 2, resist 1, and upper layer film 6 are formed on substrate 7, exposure is performed through mask 3. Next, as shown in FIG. 11B, when a baking process is performed, a mixing layer 9 is formed on the ArF resist, and then a developing process is performed (FIG. 11C). Mixing layer 9 is formed thicker because the larger the exposure amount radiated on resist 1, the greater the permeability of the solvent. Therefore, because the exposure amount is larger due to the diffraction of light in region A where the pattern density of the mask pattern is higher than in region B where the pattern density is low, the mixing layer is formed thicker in region $A_2$ where the pattern density is higher in the exposed part than in region $B_2$ where the pattern density is lower. In a similar way, the mixing layer is formed thicker in region $A_1$ where the pattern density is higher in the non-exposed part that influences the pattern dimension than in region $B_1$ where the pattern density is lower.

In the conventional method of forming a resist pattern, as shown in FIG. 2, the optical contrast decreases as the pattern density becomes high, and the exposure amount radiated changes largely depending on the sparse and dense patterns even on the non-exposed part. As a result, as shown in FIG. 7, a large difference in dissolution speed exists between a dense part and a depopulated part of the pattern even on the non-exposed part, and it becomes a cause of dimensional difference due to the sparse and dense patterns (OPE characteristic). According to the method of forming a resist pattern in the present invention, because the higher the pattern density, the thicker the mixing layer formed, the dissolution speed on the non-exposed part that influences the dimension can be suppressed more largely in the dense part of the pattern than in the depopulated part of the pattern. As a result, the difference of the dissolution speed due to the difference of the sparse and dense patterns can be made small, dissolution contrast can be improved, and deterioration of the optical contrast can be improved by the dissolution contrast. In this way, because it is necessary that the dissolution speed on the non-exposed part that influences the dimension can be suppressed more largely in the dense part of the pattern than in the depopulated part of the pattern, the dissolution speed of the acid polymer to the alkali developer is preferably 2500 nm/s or less. The thickness of the mixing layer can be changed by adding a surfactant to the upper layer film, changing the type of the solvent, or mixing a plurality of the solvents.

Figure 8:
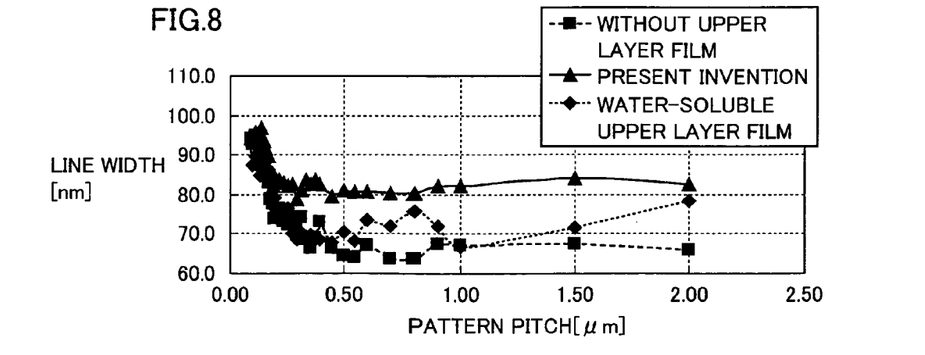
FIG. 8 is a figure showing the OPE characteristic of the resist pattern.

The OPE characteristic of the resist pattern of 90 nm spacing formed in the present invention is shown in FIG. 8 and Table 1. A 6% half-tone type phase shift mask is used as the mask, and illumination is performed at a numerical aperture (NA) 0.85, σ 0.85 as an illumination condition. In the conventional case of using an upper layer film consisting of a water-soluble polymer, because the mixing layer is not formed on the resist, an average value of the line width is 77.0 nm, and the improvement of the OPE characteristic is not observed the same as in the case of not using the upper layer film in which the average value of the line width is 75.8 nm. Compared with this, according to the present invention, by coating the ArF resist with the acid polymer dissolved in the alcohol based solvent and forming the mixing layer on the resist, the average value of the line width becomes 85.4 nm, the dissolution contrast is improved, and the OPE characteristic generated by the difference between sparse and dense mask patterns can be improved. In this way, because the OPE characteristic generated by the difference between sparse and dense mask patterns is improved, the method of forming a resist pattern in the present invention especially has an advantage in the steps in which there are many differences between sparse and dense patterns such as a device separation (STI) step, a gate step, and a wiring step including a memory cell part (dense part) and a logic part (depopulated part) especially such as a SoC device. In this way, by applying the method of forming a resist pattern in the present invention to a method of manufacturing a semiconductor device, scattering due to the difference between sparse and dense patterns is reduced, and the pattern can be formed per the designed dimension with good accuracy. Further, it is also effective in the step of forming a hole such as a contact hole and a via hole as well.

| LINE WIDTH (nm) | AVERAGE VALUE | 3σ | MAX-IMUM VALUE | MIN-IMUM VALUE | RANGE |
|---|---|---|---|---|---|
| WITHOUT UPPER LAYER FILM | 75.8 | 31.5 | 95.0 | 63.7 | 31.3 |
| PRESENT INVENTION (EXAMPLE 1) | 85.4 | 16.8 | 96.7 | 78.9 | 17.8 |
| WATER-SOLUBLE UPPER LAYER FILM | 77.0 | 24.9 | 94.1 | 66.8 | 27.3 |

In the present invention, the mixing layer is formed on the ArF resist using the acid polymer dissolved in the alcohol based solvent that does not dissolve the underlying resist on the upper layer film. Because the mixing layer is formed thicker as the pattern density of the mask pattern is higher, and is formed thinner when the pattern density is lower, the dissolution contrast can be improved depending on the pattern density when it is developed. The original optical contrast decreases as the pattern density becomes high and becomes a cause of the deterioration of the OPE characteristic. However, because the higher the pattern density is, the thicker the mixing layer in the present invention is formed, the dissolution speed on the non-exposed part where the pattern density is high is suppressed largely, and as a result, the dissolution contrast can be improved, and the difference of the dissolution contrast due to the difference between sparse and dense patterns can be improved.

Example 2

Figure 6A:
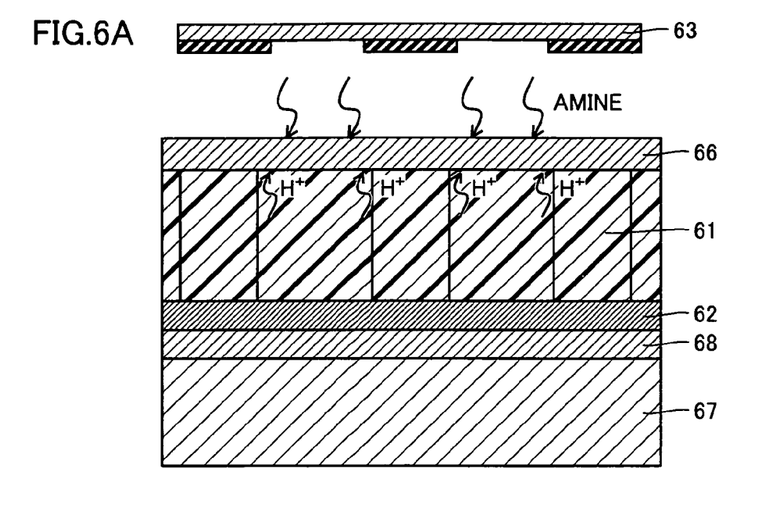
FIGS. 6A to 6C are step diagrams showing a method of forming a resist pattern in the present invention.
Figure 6B:
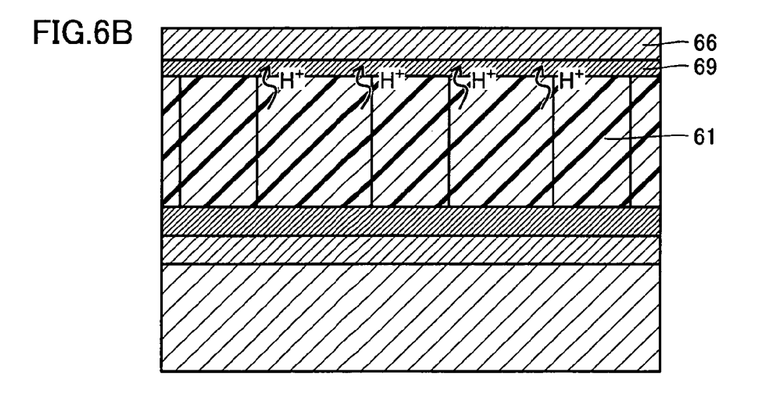
Figure 6C:
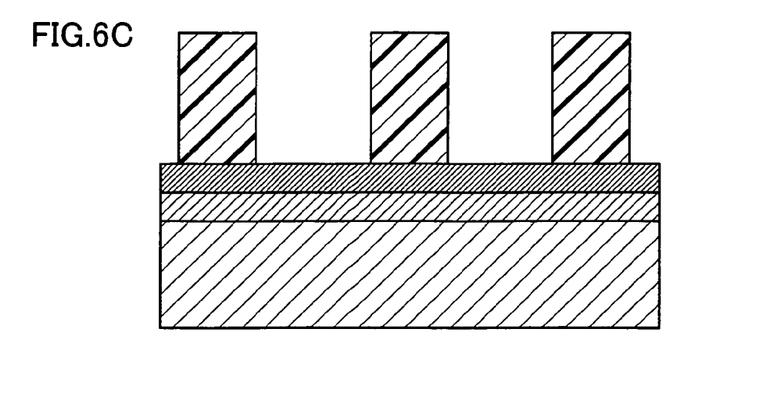

A semiconductor device is obtained in the same manner as Example 1, except that TILC-019 manufactured by Tokyo Ohka Kogyo Co. Ltd. is used as the upper layer film. A material in which the acid polymer is dissolved in the alcohol based solvent such as isobutyl alcohol is used as a material for the upper layer film. The method of forming a resist pattern from the exposure step to the developing step in the present invention is shown in FIGS. 6A to 6C. As shown in FIG. 6A, after an underlying film 68, an anti-reflective film 62, a resist 61, and an upper layer film 66 are formed on a substrate 67, exposure is performed through a mask 63. Next, as shown in FIG. 6B, when a baking process is performed, a mixing layer 69 is formed on resist 61 by the upper layer film 66, and then a developing process is performed. (FIG. 6C). In the case that the PEB process is performed, the acid catalyst is deactivated due to amine in air, and the resist is made into a T-top, the T-top layer is removed and the making into a T-top can be prevented. Because of this, the deterioration of the OPE characteristic accompanied with the deterioration of the shape of the resist can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a resist pattern by photolithography comprising the steps of:
    forming a resist having an acid dissociative dissolution suppression group on a substrate;
    forming an upper layer film by coating said resist with an acid polymer dissolved in an alcohol based solvent;
    exposing through a mask;
    performing a baking process; and
    processing with an alkali developer,
wherein in said step of performing a baking process, a mixing layer is formed between the resist and said upper layer film and in which a thicker mixing layer is formed in an unexposed part of a region where a pattern density of the mask pattern is higher than in an unexposed part of a region where said pattern density is lower.

2. The method of forming a resist pattern according to claim 1, wherein said acid polymer has a refractive index $n_d$ of 1.40 to 1.80.

3. The method of forming a resist pattern according to claim 1, wherein a dissolution speed of said acid polymer to said alkali developer is 2500 nm/s or less.

4. The method of forming a resist pattern according to claim 1, wherein said acid polymer includes at least one selected from the group consisting of an acid generator and acid compound, and wherein the acid compound is at least one selected from the group consisting of carboxylic acid having at least a fluorinated hydrocarbon group, sulfonic acid having at least a fluorinated hydrocarbon group, and sulfonyl compounds having at least a fluorinated hydrocarbon group.

5. The method of forming a resist pattern according to claim 1, wherein said acid polymer includes a nitrogen compound, and wherein said nitrogen compound is at least one selected from the group consisting of quaternary ammonium hydroxide, alkanolamine compounds, and amino derivatives.

6. The method of forming a resist pattern according to claim 1, wherein the acid dissociative dissolution suppression group includes an aliphatic polycyclic group.

7. The method of forming a resist pattern according to claim 6, wherein the polycyclic group is selected from the group consisting of a group in which one hydrogen atom is removed from bicycloalkane which is substituted with a fluorine atom, a group in which one hydrogen atom is removed from bicycloalkane which is substituted with a fluorinated alkyl group, a group in which one hydrogen is removed from bicycloalkane which is unsubstituted, a group in which one hydrogen atom is removed from tricycloalkane which is substituted with a fluorine atom, a group in which one hydrogen atom is removed from tricycloalkane which is substituted with a fluorinated alkyl group, a group in which one hydrogen atom is removed from tricycloalkane which is unsubstituted, a group in which one hydrogen atom is removed from tetracycloalkane which is substituted with a fluorine atom, a group in which one hydrogen atom is removed from tetracycloalkane which is substituted with a fluorinated alkyl group, and a group in which one hydrogen atom is removed from tetracycloalkane which is unsubstituted.

8. A method of manufacturing a semiconductor device using the method of forming a resist pattern according to claim 1 comprising a step of forming a resist pattern on a semiconductor substrate or a underlying film formed on the semiconductor substrate and a step of patterning said semiconductor substrate or said underlying film using said resist pattern as a mask.

* * * * *